United States Patent [19]
Mori et al.

[11] Patent Number: 5,782,994
[45] Date of Patent: Jul. 21, 1998

[54] SOLAR CELL MODULE PROVIDED WITH MEANS FOR FORMING A DISPLAY PATTERN

[75] Inventors: Masahiro Mori, Sora-gun; Kimitoshi Fukae; Yuji Inoue, both of Nara; Takashi Ohtsuka, Tsuzuki-gun, all of Japan

[73] Assignee: Canon Kabushiki Kaisha, Tokyo, Japan

[21] Appl. No.: 723,826

[22] Filed: Sep. 30, 1996

[30] Foreign Application Priority Data

Sep. 18, 1995 [JP] Japan ................. 7-273725

[51] Int. Cl.$^6$ ................................. H01L 31/048
[52] U.S. Cl. ............... 136/251; 136/259; 438/64; 156/285; 156/311
[58] Field of Search .................. 136/251, 259; 257/433; 438/64, 66–67; 156/285, 311, 323

[56] References Cited

U.S. PATENT DOCUMENTS 5,466,302  11/1995  Carey et al. ................. 136/251

FOREIGN PATENT DOCUMENTS

| | | | |
|---|---|---|---|
| 61-41261 | 3/1986 | Japan . | |
| 63-143878 | 6/1988 | Japan | 136/256 |
| 5-38464 | 6/1993 | Japan | 136/257 |
| 6-27964 | 4/1994 | Japan . | |
| 2042802 | 9/1980 | United Kingdom | 136/251 |

*Primary Examiner*—Nam Nguyen
*Attorney, Agent, or Firm*—Fitzpatrick, Cella, Harper & Scinto

[57] ABSTRACT

A solar cell module comprising at least one solar cell element and at least a front surface covering material disposed to cover the light receiving face of said at least one solar cell element, said surface side covering material comprising a light transmissive resin and a light transmissive surface protective film situated on the outermost surface in contact with said light transmissive resin, characterized in that said front surface side covering material includes means for forming a desired display pattern on the light receiving face of said at least one solar cell element, said means comprising (a) a patterned surface region forming said desired display pattern and (b) another patterned surface region having a surface pattern which is different from that of said patterned surface region (a), and said patterned surface region (a) and said patterned surface region (b) being situated next to each other.

26 Claims, 8 Drawing Sheets

SOLAR CELL MODULE PROVIDED WITH MEANS FOR FORMING A DISPLAY PATTERN

BACKGROUND OF THE INVENTION

1. Field of the Invention

The present invention relates to a solar cell module having a surface provided with a display pattern of a desired character, designation, or design on the light receiving face side thereof.

2. Related Background Art

In recent years, societal consciousness of the problems relating to the environment and energy has been increasing all over the world. Particularly, heating of the earth because of the so-called greenhouse effect due to an increase of atmospheric $CO_2$ has been predicted to cause a serious problem. In view of this, there is an increased demand for means of power generation capable of providing clean energy without causing $CO_2$ buildup.

Public attention has been focused on solar cells capable of serving as a non-exhaustible electric power source without causing such a problem as above mentioned while meeting such demand.

In order to use such a solar cell as a power generation source, it is usually manufactured as a solar cell module in a desired configuration which can be used as the power generation source. And such a solar cell module has been widely used in practice as a power generation source by installing it, for instance, on the ground or on the roof of a building.

For the solar cell module, there are various design requirements so that it can be installed at a selected location in a desirable installation state. For instance, in the case of a solar cell module which is integrated with the roof of a building (this solar cell module will be hereinafter referred to as roof type solar cell module), there is a need to configure it such that a display of a desired character or designation can be readily formed at a surface thereof on the light receiving face side.

The roof type solar cell module serves also as a roof member, and it has a configuration, for example, as shown in FIGS. 1 and 2. The solar cell module configured as shown in FIGS. 1 and 2 can be used as a roof member in a batten-seam roof construction (or ribbed seam roofing).

Description will now be given of the roof type solar cell module shown in FIGS. 1 and 2.

In FIGS. 1 and 2, reference numeral 35 indicates the entire roof type solar cell module having opposite portions bent at 90° without fixing means for installing the solar cell module on the roof of a building. The solar cell module 35 comprises a solar cell element 36 enclosed by a light transmissive sealing resin 39, a light transmissive surface protective film 38 laminated on the light transmissive sealing resin 39 on the light receiving face side of the solar cell element 36, and a back face reinforcing member 37 laminated on the light transmissive sealing resin 39 on the rear side of the solar cell element 36.

The solar cell module 35 has power output means including positive and negative terminals (not shown) of the solar cell element 36 that extend outside of the solar cell module through openings (not shown) formed through opposite side end portions of the back face reinforcing member 37 in the longitudinal direction and which are housed in an electrical output box 40 fixed to the back face reinforcing member 37 wherein they are connected to a pair of wires 41, and the wires 41 are connected to a one-touch type connector.

In the case where the above solar cell module is arranged on the roof of a building having a clay tile roofing system, its wiring connection must be conducted so as to conform to the requirements of a given electric design specification. In the required installation work of the solar cell module, it is desired that the solar cell module has an indication which enables one to readily identify either the positive terminal side or the negative terminal side simply by referring to the light receiving side of the solar cell module. If the solar cell module does not have such an indication, extra work is sometimes required in order to install the solar cell module as desired because confirmation of the positive or negative terminal side by looking at the rear face side is necessary to be conducted prior to installation.

Further, there is a demand for a solar cell module (including the roof type solar cell module) to display a character or designation by which it can be readily distinguished, as a form of burglarproofing. This means that by making the solar cell module with a display indicating its owner at the light receiving side which is exposed to the public view, it is expected to prevent the solar cell module from being stolen.

In addition, there is also a demand for a solar cell module (including the roof type solar cell module) to be configured such that a display of a desired designation which excels in design appearance can be formed on the light receiving side, since the solar cell module is often used as a construction member of a building, for example, as a roof, wall or the like.

Hence, there is a societal demand to provide a solar cell module having a display pattern of a desired character or designation on the light receiving side.

In order to meet the above demand, such proposals as will be described below have been made.

Japanese registered utility model publication No. 61-41261/1986 (hereinafter referred to as Document 1) discloses a solar cell module having a configuration in which a penetration pattern of a desired character, designation or the like is provided in the semiconductor layer forming the photoelectric conversion region, said penetration pattern is filled by an insulating material having a desired color, and said character, designation or the like is realized due to a difference between the color of the semiconductor layer and that of the insulating material.

In the configuration of Document 1, the penetration pattern corresponds to a region in which power generation is not conducted (this region will be hereinafter referred to as non-power generation region). Therefore, the configuration of Document 1is problematic in that as the area of the penetration pattern is increased, the area of the non-power generation region is increased to cause a reduction in the power generation efficiency of the solar cell module, and because of this, there is a limit on the area of the penetration pattern to be provided.

Japanese registered utility model publication No. 6-27964/1994 (hereinafter referred to as Document 2) discloses a solar cell module having a configuration in which a solar cell element and a colored light scattering reflector are arranged in a mosaic state so that a desired character, designation or the like is realized by virtue of the colored light scattering reflector. In the configuration of Document 2, the colored light scattering reflector corresponds to a non-power generation region. Hence, the configuration of Document 2 also has a problem similar to that of the configuration of Document 1.

Japanese patent publication No. 5-38464/1993 (hereinafter referred to as Document 3) discloses a colored solar cell module which does not have a non-power generation region. Particularly, the solar cell module of Document 3 has a configuration in that a color filter and a color diffusing layer are disposed on the front face of a solar cell element, wherein the color filter is capable of transmitting light having a wavelength matched to the power generation spectrum of the solar cell element, and the color diffusing layer comprises a light scattering layer capable of transmitting a part of the light transmitted by the color filter and scattering the residual light.

Each of the above described configurations has an advantage in that the formation of a desired character, designation or the like can be realized but each has a drawback in that a remarkable reduction results in the power generation efficiency. Particularly, in each of the configurations described in Documents 1 and 2 there is established a specific non-power generation region separate from the power generation region comprising the solar cell element in order to form a desired character, designation or the like so that the character, designation or the like can be distinguished due to a difference between the color of the power generation region and that of the non-power generation region. Hence, each of the configurations described in Documents 1 and 2 has a problem in that as the area fraction of the entire surface of the solar cell module which is occupied by the area indicating the character, designation or the like is increased, the power generation efficiency of the solar cell module is decreased as much as the increase in the area fraction.

Now, in order to form a desired character, designation or the like without establishing the foregoing non-power generation region, it is considered that use of the configuration of the colored solar cell module described in Document 3 will be effective. In this case, there is an idea to modify the configuration of Document 3 such that the color filter (capable of transmitting light having a wavelength matched to the power generation spectrum of the solar cell element) and the color diffusing layer (comprising the light scattering layer capable of transmitting part of the light transmitted by the color filter and scattering the residual light) are disposed on the front face of the solar cell element, wherein the color filter and color diffusing layer are shaped in a form corresponding to a desired character, designation or the like. This arrangement would form the character, designation or the like due to a difference between the color of the color filter and color diffusing layer and that of the solar cell element. Particularly, it is different from each of the configurations described in Documents 1 and 2 in which the non-power generation region is established, in that the portion of indicating the character, designation or the like corresponds to a region providing power generation. However, in this case, a problem unavoidably arises in that a remarkable reduction is caused in the power generation because a reflectance of about 30 to 50% and a transmittance of about 60 to 40% for incident sunlight are required in order to offset the lowered power generation efficiency as described in Document 3.

Hence, in the prior art, in the case of a solar cell module having a configuration wherein formation of a desired character, designation or the like is realized, in practice such solar cell modules are used principally for design purposes while disregarding the reduction in the power generation efficiency.

In fact, there has not yet been provided a solar cell module having a display of a desired character, designation or the like on the light receiving side which exhibits a satisfactory power generation efficiency.

SUMMARY OF THE INVENTION

The present invention is aimed at eliminating the foregoing problems in the prior art and providing a solar cell module having an improved configuration which enables formation of a desired indication without a reduction in the power generation efficiency such as found in the prior art.

Another object of the present invention is to provide a solar cell module having a configuration wherein a display forming a desired character, designation or the like can be realized on the light receiving side without entailing a reduction in the power generation efficiency.

A further object of the present invention is to provide a solar cell module having a surface covering material by which at least one solar cell element is sealed, said surface covering material having a pattern indicating means for providing a display pattern of a desired character, designation or design on the light receiving side, said pattern indicating means comprising (a) a patterned surface region capable of forming said display pattern and (b) another patterned surface region having a pattern which is different from that of said patterned surface region (a), and said two patterned surface regions (a) and (b) being situated next to each other.

A further object of the present invention is to provide a process for the production of said solar cell module.

DESCRIPTION OF THE INVENTION AND PREFERRED EMBODIMENTS

Figure 1:
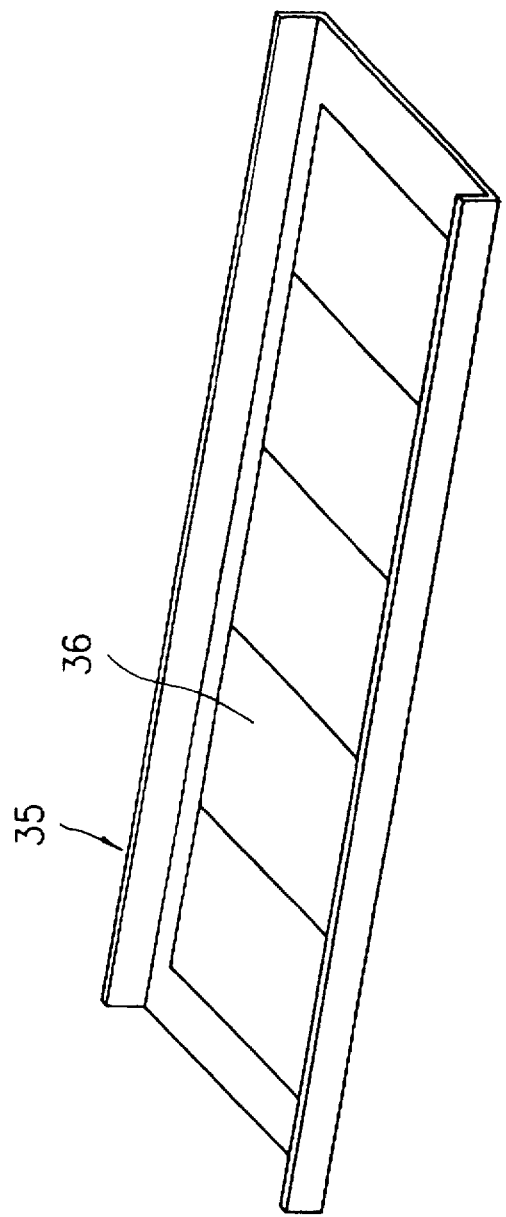
FIG. 1 is a schematic view of a roof type solar cell module, viewed from the light receiving face side.
Figure 2:
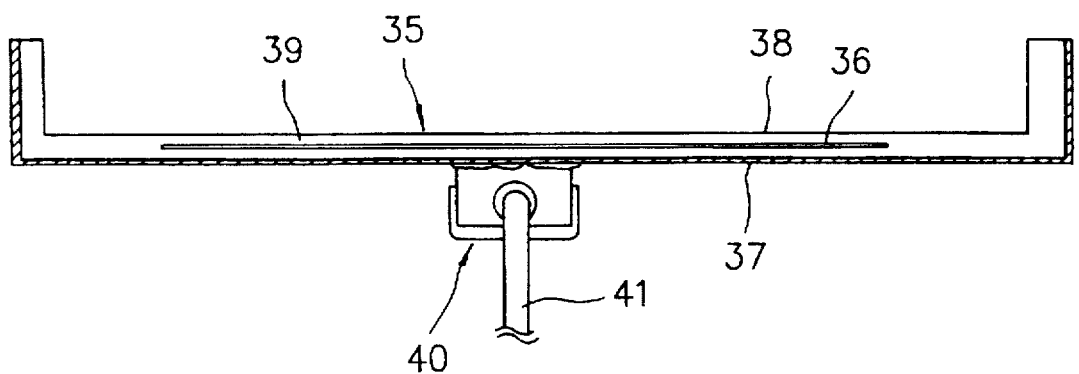
FIG. 2 is a schematic cross-sectional view of the roof type solar cell module shown in FIG. 1.

A typical embodiment of the solar cell module provided according to the present invention comprises a solar cell element and at least a surface covering material disposed to cover the light receiving face of said solar cell element, said surface covering material comprising at least a light transmissive resin and a light transmissive surface protective film situated on the outermost surface side while contacting said light transmissive resin, wherein said surface covering material has a pattern indicating means for providing a display pattern of a desired character, designation or design on the light receiving face, said pattern indicating means comprising (a) a patterned surface region capable of forming said display pattern and (b) another patterned surface region having a surface pattern which is different from that of said patterned surface region (a), and said patterned surface region (a) and said patterned surface region (b) being situated next to each other.

The patterned surface region (b) is meant to include a surface region provided upon forming the patterned surface region (a), an uneven surface region and a planar surface region which are different from the patterned surface region (a) in terms of the surface pattern.

The display pattern of the pattern indicating means on the light receiving face of the solar cell module according to the present invention may be an indicating pattern by which the positive or negative terminal sides can be distinguished or an indicating pattern by which the owner of the solar cell module can be distinguished. Alternatively, the display pattern may be a design pattern which makes the exterior surface of the solar cell module exhibit a good appearance.

In the solar cell module according to the present invention, as above described, the surface covering material (comprising at least the light transmissive resin and the light transmissive surface protective film situated on the outermost surface side of the solar cell module while contacting said light transmissive resin) has a specific pattern indicating means comprising the patterned surface region (a) capable of forming a desired display pattern of a character, designation or design and the patterned surface region (b) having a surface pattern which is different from that of the patterned surface region (a) wherein the patterned surface region (b) is situated next to the patterned surface region (a). The two different patterned surface regions (a) and (b) which are situated next to each other make the display pattern three-dimensionally visible on the light receiving face of the solar cell module so as to enable one to easily distinguish the meaning of the display pattern, where the presence of the two different patterned surface regions (a) and (b) on the light receiving face of the solar cell module does not entail a reduction in the power generation efficiency of the solar cell module.

In the case where the display pattern on the light receiving face of the solar cell module comprises an indicating pattern indicating the positive and negative terminal sides of the solar cell module, the positive or negative terminal sides of the solar cell module can be easily distinguished merely by looking at the light receiving face of the solar cell module. This situation enables a remarkable reduction of the work load in the installation of the solar cell module at a desired location.

Particularly, the solar cell module according to the present invention has such pronounced advantages as will be described in the following. That is, the solar cell module can be readily installed on a roof of a building while readily confirming a given position of the roof at which the solar cell module is to be installed. Specifically in this respect, the solar cell module can be readily installed at a predetermined location of the roof with reference to the indication display thereof so that the location of the solar cell module on the roof always can be readily and surely distinguished according to the indication display. Therefore, the solar cell module according to the present invention enables desired installation and desired electric connections corresponding to a design specification without entailing confusion in the installation work.

In addition, the solar cell module according to the present invention provides a display indicating the owner thereof on the light receiving face side thereof, which is exposed to the public, in a state such that the indication display is difficult to remove. This situation is effective in terms of burglar-proofing.

Further, the solar cell module according to the present invention excels in exterior appearance in view of its design and therefore, it can be desirably used for various purposes, for instance, as a building construction member and the like.

The present invention includes a process for the production of a solar cell module having the above described configuration. The process according to the present invention enables efficient production of a solar cell module having such a pattern indicating means as above described and which exhibits a satisfactory power generation efficiency at a reasonable production cost. This situation can be understood with reference to examples which will be later described.

Specifically, the process according to the present invention is characterized by including the steps of:

(i) sequentially stacking a solar cell element, a light transmissive sealing resin, a light transmissive surface protective film, a member capable of forming an uneven display pattern, and a covering member on a mounting table provided with an exhaust port to form a stacked body on the mounting table, and (ii) maintaining the stacked body while applying vacuum through the exhaust port of the mounting table.

In the following, description will be made of the solar cell module while referring to FIGS. 3 and 4.

Figure 3:
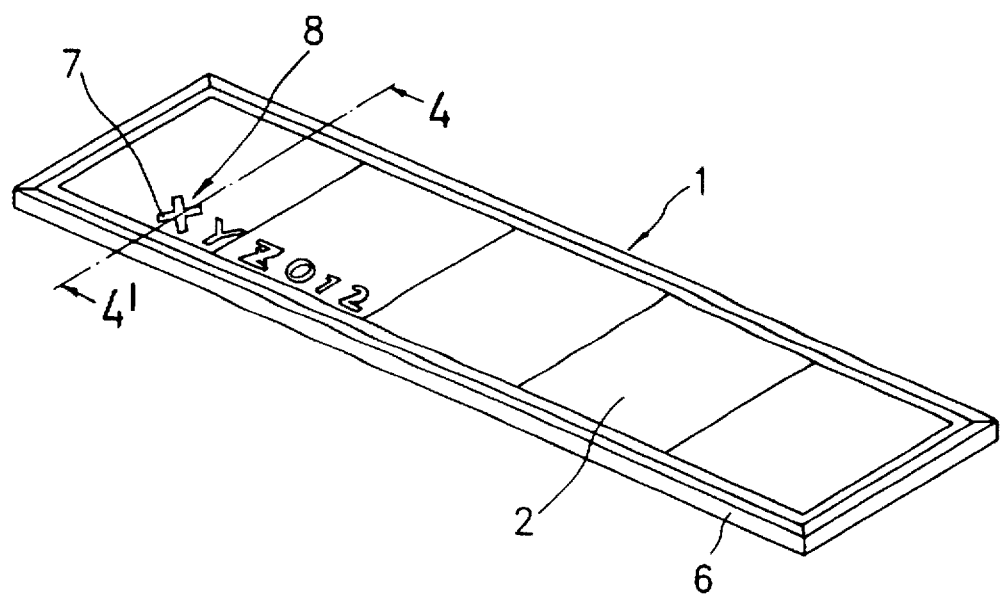
FIG. 3 is a schematic view illustrating an example of a solar cell module according to the present invention, viewed from the light receiving face side.

FIG. 3 is schematic view illustrating an example of a solar cell module according to the present invention, viewed from the light receiving face side. FIG. 4 is a schematic cross-sectional view, taken along the line 4-4' in FIG. 3.

Figure 4:
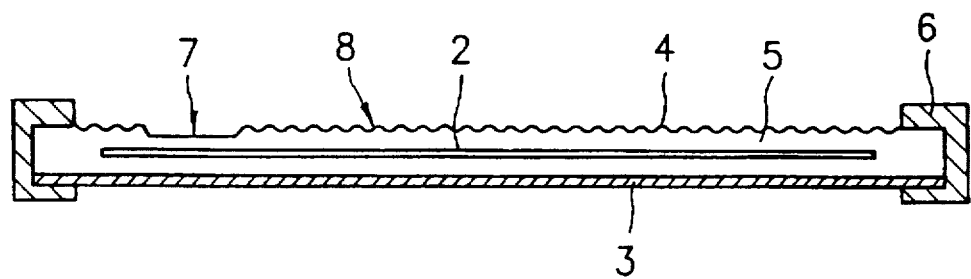
FIG. 4 is a schematic cross-sectional view, taken along the line 4-4' in FIG. 3.

The solar cell module shown in FIGS. 3 and 4 has an uneven surface provided with a number of minute irregularities which provide a display region of "XYZ012" in a given area thereof.

Particularly, the solar cell module shown in FIGS. 3 and 4 comprises a solar cell element 2 enclosed by a light transmissive sealing resin 5, a light transmissive surface protective film 4 laminated on the light transmissive sealing resin 5 situated on the light receiving front face of the solar cell element 2, and a back side reinforcing member 3 laminated on the light transmissive sealing resin 5 situated on the rear side of the solar cell element.

The solar cell module shown in FIGS. 3 and 4 has an uneven surface region 8 formed on the surface protective film 4, which is provided with a display region 7 of "XYZ012" at a desired position of the uneven surface region 8. And the solar cell module is provided with a frame 6 at the periphery thereof for the purposes of improving the structural strength of the solar cell module and enabling one to readily install the solar cell module on a support table or a roof of a building.

The solar cell element 5 may be, for example, an amorphous silicon solar cell element provided with a stainless steel substrate. The back reinforcing member 3 is desired to comprise a metallic member which is satisfactory in strength. The frame 6 is desired to be constituted by aluminum in view of making the solar cell module lightweight and also in view of making the solar cell module capable of being easily handled.

The solar cell module shown in FIGS. 3 and 4 displays a character, namely "XYZ012" in this case, which is three-dimensionally visible, enabling one to easily distinguish the indication display, due to a difference between the surface pattern of one surface region of the front surface covering material and that of another surface region of the surface covering material wherein the two different surface regions are situated next to each other.

The surface of the display region 7 having the display of "XYZ012" is shaped to have, for instance, recesses and the surface of the region 8 situated next to the display region 7 is shaped to have, for instance, a number of minute irregularities. The presence of the two different regions each having a different surface pattern three-dimensionally visualizes the indication display on the light receiving face of the solar cell module.

Description will now be made of the formation of a surface shaped to have such two different surface regions.

For instance, in the case where a solar cell module is prepared by thermocompressing a stacked body comprising a solar cell element and a light transmissive resin while vacuuming the stacked body to seal the solar cell element with the light transmissive resin, the formation of the two different surfaces at the front surface of the solar cell module is desired to be conducted concurrently upon sealing the solar cell element with the light transmissive resin.

Figure 6:
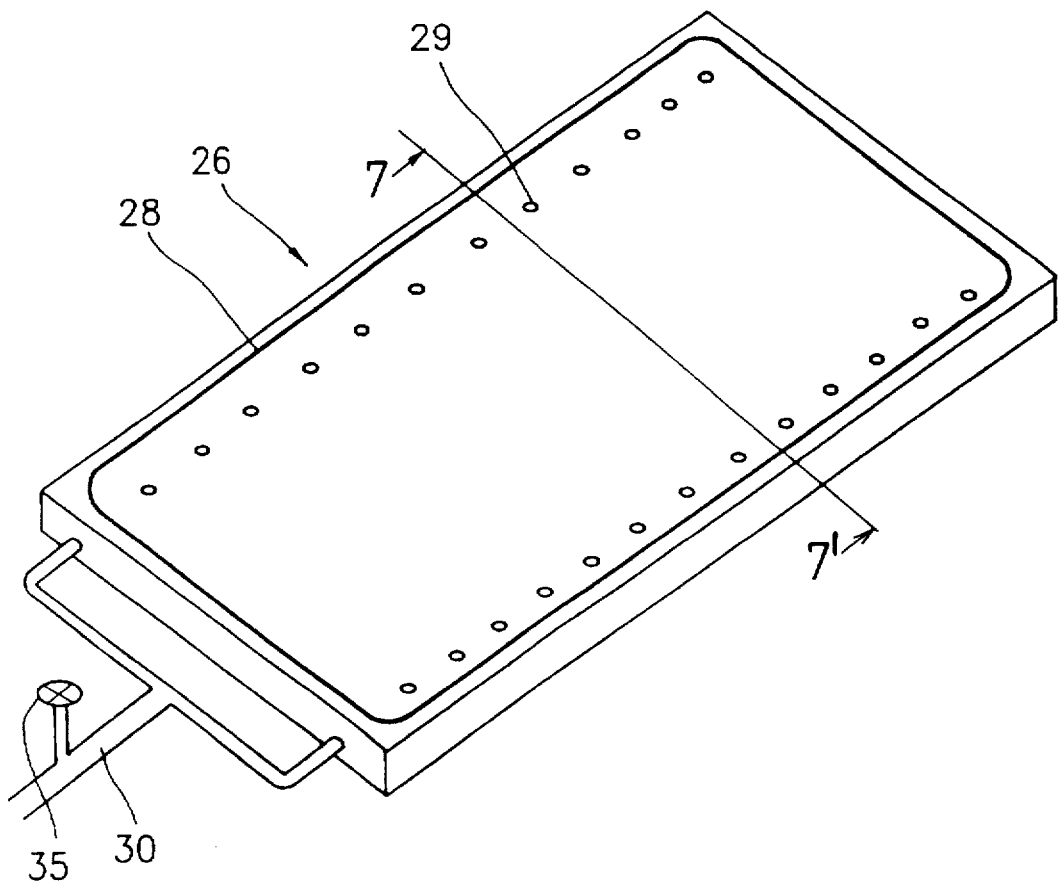
FIG. 6 is a schematic diagram illustrating a thermocompression laminator used for the preparation of a solar cell module in the present invention.
Figure 7:
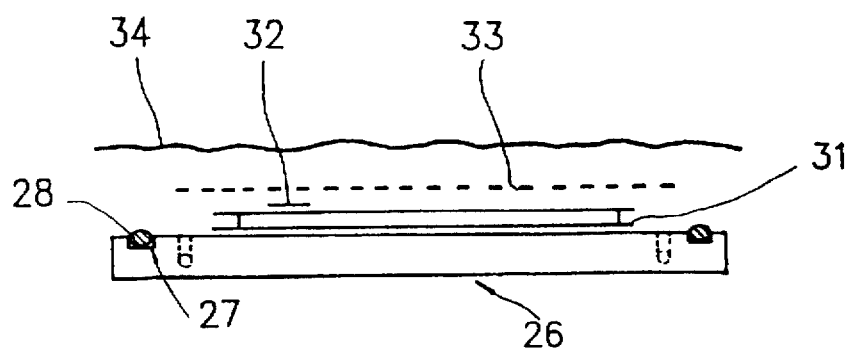
FIGS. 7 to 10 are schematic cross-sectional views respectively taken along the line 7-7' in FIG. 6, for explaining thermocompression treatment procedures for the preparation of a solar cell module using the laminator shown in FIG. 6.
Figure 8:
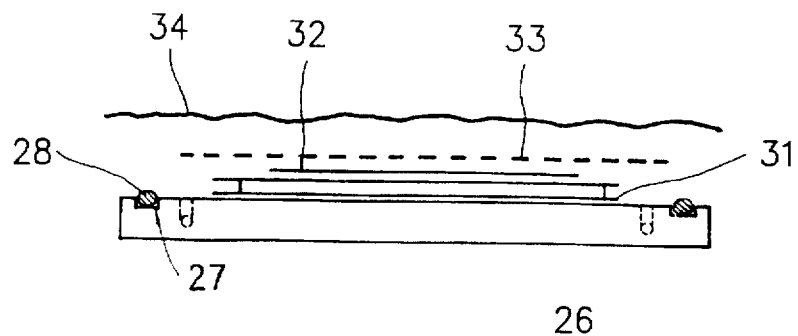

Specifically, the formation of the surface shaped to have the two different regions at the surface of the solar cell module may be conducted in the thermocompression treatment procedures for lamination and thermocompression of a solar cell module using, for instance, a single-chambered vacuum laminator shown in FIG. 6 and in accordance with the thermocompression treatment procedures shown in FIGS. 7 or 8.

FIG. 6 is a schematic diagram illustrating the laminator used for the preparation of a solar cell module. FIGS. 7 to 10 are schematic cross-sectional views, respectively taken along the line 7-7' in FIG. 6, for explaining the thermocompression treatment procedures for the preparation of a solar cell module using the laminator shown in FIG. 6.

The laminator shown in FIG. 6 comprises a mounting table 26 made of aluminum, on which an object to be treated is to be mounted, and a covering member 34 comprising a silicone rubber sheet (see FIGS. 7 to 10) which serves to enclose the object on the mounting table.

The mounting table 26 is provided with a groove 27 (see FIGS. 7 to 10) having an O-ring 28 made of a heat-resistant resin embedded therein at its periphery so as to circumscribe the object on the mounting table.

The mounting table 26 is provided with an exhaust system comprising ports 29 arranged inside the groove 27, the ports 29 being connected to an exhaust pipe 30 connected to a vacuum pump (not shown). The exhaust pipe 30 is provided with a valve 35. The mounting table is further provided with an electric heater (not shown) for heating the object.

Reference numeral 31 in FIGS. 7 to 10 indicates a release member comprising a Teflon (trademark name) film which is laid on the surface of the mounting table 26 for the purpose of preventing the surface of the mounting table from being stained by fluidized resin.

Reference numeral 32 in FIGS. 7 and 8 indicates a member for forming a display region. Reference numeral 33 in FIGS. 7 to 9 indicates a mesh member for forming an uneven surface.

The preparation of a solar cell module using the laminator shown in FIG. 6 and in accordance with the thermocompression treatment procedures shown in FIGS. 7, 8, 9, or 10 is conducted, for example, in the following manner. First, the release member 31 is laid on the surface of the mounting table 26. Starting members including a solar cell element for the preparation of a solar cell module are stacked to form a stacked body on the release member 31 on the mounting table 26. The covering member 34 is superposed over the stacked body on the mounting table 26 while sealing between the mounting table 26 and the covering member 34 by means of the O-ring 28. The vacuum pump (not shown) is operated and the valve 35 is opened, whereby the inside of the space containing the stacked body between the covering member 34 and the mounting table 26 is exhausted through the exhaust system to sag the covering member toward the mounting table 26 side thereby compressing the stacked body. While continuing the vacuuming operation by operating the vacuum pump, the resultant (hereinafter referred to as lamination instrument) is introduced into a furnace (not shown) maintained at a desired temperature, where the stacked body in the lamination instrument is subjected to thermocompression treatment. While still continuing the vacuuming operation by operating the vacuum pump, the lamination instrument is taken out from the furnace, followed by cooling to about room temperature. Then, the operation of the vacuum pump is terminated to return the pressure of the inside of the space containing the stacked body between the covering member 34 and the mounting table 26 to atmospheric pressure, followed by removing the covering member 34 and taking out the treated stacked body. Thus, there is obtained a solar cell module.

In the following, description will be made of a typical example of preparing a solar cell module, using the laminator shown in FIG. 6 and in accordance with the thermocompression treatment procedures shown in FIG. 7.

First, a Teflon (trademark name) film as the release member 31 is laid on the surface of the mounting table 26. Then, on the release member 31 laid on the surface of the mounting table 26, there are laminated a 0.4 mm thick galvanized steel member as a back face reinforcing member, a 900 μm thick EVA (ethylene-vinyl acetate) resin sheet as the light transmissive sealing resin, an amorphous silicon solar cell element provided with a stainless steel substrate having the constitution shown in FIGS. 5(A) and 5(B) (which will be later described) as the solar cell element, a 900 μm thick EVA (ethylene-vinyl acetate) resin sheet as the light transmissive sealing resin, and a 50 μm thick fluororesin film as a light transmissive surface protective film to form a laminate situated on the release member 31.

In the above, the size of each of the galvanized steel member, EVA sheet and fluororesin film is greater than that of the solar cell element. And it is desired for the size of each of the two EVA sheets to be smaller than that of the fluororesin film in order to prevent fluidized resin from the EVA sheets from adhering to other members.

Then, six character patterns formed of a 0.6 mm thick stainless steel plate and having a predetermined small size as the display-forming member 32 (see FIG. 7) are spacedly arranged and laminated on a predetermined area of the surface of the fluororesin film of the laminate, followed by laminating an aluminum mesh member of 16×18 in mesh size and 0.011 inch in linear diameter as the uneven surface-forming member 33 (see FIG. 7) and having a size greater than that of the solar cell element so as to cover the surface of the fluororesin film of the laminate, thereby forming a stacked body situated on the release member. Successively, a silicone rubber sheet as the covering member 34 is superposed over the stacked body on the mounting table 26 while sealing between the mounting table 26 and the covering member 34 by means of the O-ring 28. The vacuum pump (not shown) is operated and the valve 35 is opened, whereby the inside of the space containing the stacked body between the covering member 34 and the mounting table 26 is exhausted through the exhaust system to sag the covering member toward the mounting table 26 side thereby compressing the stacked body. In this case, the stacked body is vacuumed into a state such that the constituents of the stacked body are uniformly compressed.

Then, while continuing the vacuuming operation by operating the vacuum pump, the resultant (hereinafter referred to as the lamination instrument) in the above is introduced into a furnace (not shown) maintained at a temperature which is higher than the melting point of the constituent resin of the EVA sheets, whereby the stacked body in the lamination instrument is subjected to thermocompression treatment. In this case, the thermocompression treatment in the furnace is continued until the EVA sheets are heated to a temperature higher than their melting point to soften and to promote chemical reaction of the EVA sheets to exhibit sufficient adhesion. Thereafter, while still continuing the vacuuming operation by operating the vacuum pump, the lamination instrument is taken out from the furnace, followed by cooling to about room temperature. Then, the operation of the vacuum pump is terminated to return the pressure of the inside of the space containing the stacked body between the covering member 34 and the mounting table 26 to atmospheric pressure, followed by removing the covering member 34 and taking out the treated stacked body. The six character patterns and the aluminum mesh member are removed from the treated stacked body. Thus, there is obtained a solar cell module.

In the above thermocompression treatment in the furnace, when the EVA sheets are heated at a temperature exceeding their melting point to soften, the six stainless steel character patterns are continuously compressed, and because of this, there is provided a recessed surface pattern corresponding to the six stainless steel character patterns. And when the stacked body is cooled to about room temperature, the EVA resin is hardened, and when the stacked body is released from the compression, said recessed surface pattern is maintained.

Hence, the resultant solar cell module has an uneven surface based on the aluminum mesh member which is provided with a recessed surface pattern based on the six stainless steel character patterns in a given area of the uneven surface.

This solar cell module is satisfactory in terms of the power generation efficiency. This can be understood with reference to the results of later described Example 1 in which a solar cell module having the configuration shown in FIGS. 3 and 4 was prepared and the resultant solar cell module was evaluated with respect to power generation efficiency.

For the reason why a solar cell module having a surface provided with a patterned surface region forming a display of a desired character, designation or the like and another patterned surface region which is different from the former surface region in terms of the surface pattern and which is situated next to the former exhibits a satisfactory power generation efficiency, the following explanation is offered.

Firstly, in the present invention, in order to form said display pattern, a non-power generation region such as formed in the prior art is never established. Particularly, as previously described, in the prior art of Documents 1 and 2, a specific non-power generation region dedicated for forming a desired character, designation or the like is provided in addition to the power generation region of the solar cell element, wherein the character, designation or the like is distinguished due to a difference between the color of the non-power generation region and that of the power generation region. However, this is problematic in that as the area fraction of the entire surface of the solar cell module which is occupied by the area indicating the character, designation or the like is increased, the power generation efficiency of the solar cell module is decreased in proportion to the area fraction. On the other hand, in the present invention, such a specific non-power generation region is never provided and because of this, such reduction in the power generation efficiency in the prior art never occurs.

Secondly, the present invention is free from such a problem found in the prior art of Document 3 in that sunlight having a particular wavelength is intentionally reflected in order to realize the formation of a desired pattern due to color difference and because of this, said sunlight is not used for power generation. That is, in the present invention, whenever any surface pattern is provided on the front surface covering material, no distinguishable difference is found for the quantity of sunlight impinged into the solar cell element of the solar cell module. Particularly, because intentional reflection of sunlight having a particular wavelength in order to realize the formation of a desired pattern due to color difference is never conducted, no practically problematic change in the quantity of sunlight impinged through the entire surface of the solar cell module occurs.

Now, in the present invention, it is considered that the thickness of the front surface covering material is somewhat changed due to having such two different surface patterns as above described to cause a loss in the quantity of sunlight passing therethrough to arrive in the solar cell element. But in practice, said loss is slight so that it does not cause a practically problematic reduction in the power generation efficiency.

Now, the display of a given designation such as "XYZ012" on the light receiving face of the solar cell module in the present invention can be used as a characteristic identification of the solar cell module which is registered in a customer's list designating its owner. The solar cell module according to the present invention which is provided with such display by which the owner can be distinguished on the light receiving face which is exposed to public view in a state such that it is difficult to remove is effective in terms of burglarproofing. In the solar cell module according to the present invention, it is possible to directly indicate the name of the owner or a logogram of the producer on the light receiving face thereof.

In the present invention, as previously described, it is possible to readily produce a solar cell module having a surface provided with a display capable of indicating a desired character, designation or design, for instance, such as "XYZ012" on the light receiving face by conducting a simple step of arranging a display-forming pattern corresponding to said desired character, designation or design, for instance, the foregoing display-forming pattern comprising the six stainless steel character patterns on a predetermined area of the surface of a stacked body for a solar cell module in the thermocompression treatment procedures for the preparation of the solar cell module. In addition, the said display-forming pattern can be repeatedly used. Thus, the present invention provides a process of efficiently producing a solar cell module having a surface provided with a display capable of indicating a desired character, designation or design on the light receiving face at a reasonable production cost.

In the following, description will be made of each constituent of the solar cell module.

Solar Cell Element

The solar cell elements usable in the solar cell module according to the present invention can include single crystal silicon solar cell elements, polycrystal silicon solar cell elements, amorphous silicon solar cell elements, copper-indium-selenide solar cell elements, and compound semiconductor solar cell elements. These solar cell elements are desired to be configured to have flexibility. Of these solar cell elements, amorphous silicon solar cell elements having a stainless steel substrate are the most appropriate.

In the case of using a solar cell element having flexibility, there can be produced a desirable solar cell module having flexibility which can be used as a roof member of a building. And the solar cell module in this case is advantageous in that it is hardly damaged even when somebody steps thereon, for instance, in the installation work.

Figure 5A:
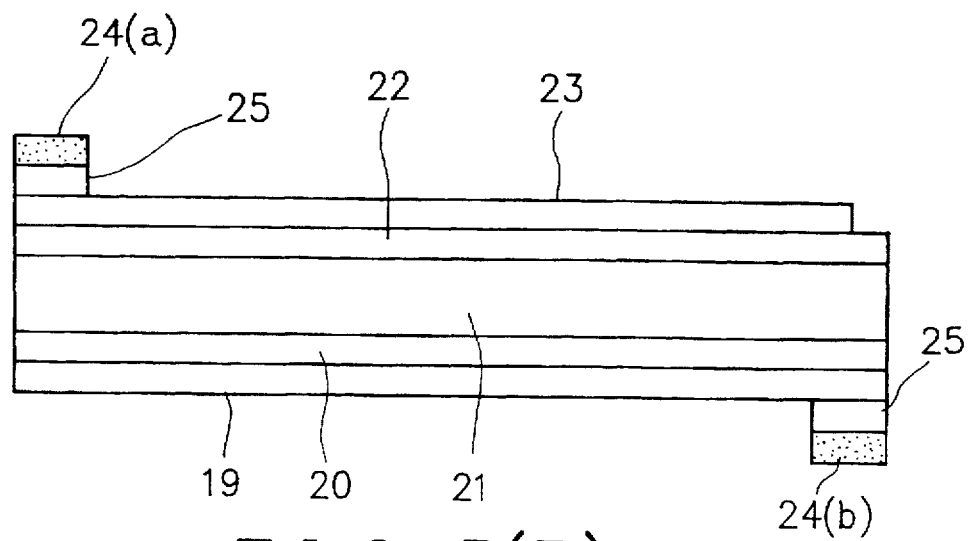
FIG. 5(A) is a schematic cross-sectional view illustrating the constitution of an example of a photovoltaic element (or a solar cell element) which can be used in the present invention.
Figure 5B:
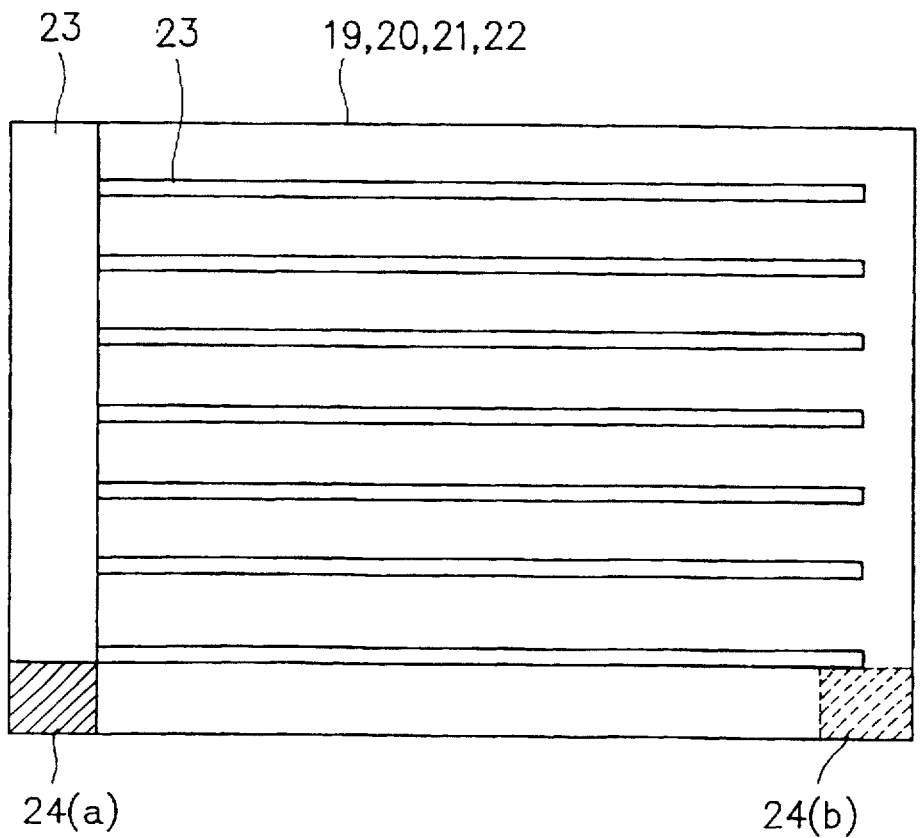
FIG. 5(B) is a schematic plan view illustrating the light receiving face of the photovoltaic element shown in FIG. 5(A).

As a specific example of such amorphous silicon solar cell element, there can be mentioned an amorphous silicon solar cell element having the constitution shown in FIGS. 5(A) and 5(B). FIG. 5(A) is a schematic cross-sectional view illustrating the constitution of an amorphous silicon solar cell element. FIG. 5(B) is a schematic plan view illustrating the light receiving face of the solar cell element shown in FIG. 5(A).

In FIGS. 5(A) and 5(B), reference numeral 19 indicates an electrically conductive substrate (for example, comprising a 125 µm thick stainless steel plate) capable of also serving as a lower electrode; reference numeral 20 a back reflecting layer having a two-layered structure (comprising, for example, a metal layer and a layer composed of a metal oxide such as ZnO); reference numeral 21 a semiconductor photoactive layer (comprising, for example, an amorphous silicon layer with a pin junction); reference numeral 22 a transparent and conductive layer (comprising, for example, $In_2O_3$) capable of serving as an upper electrode; reference numeral 23 a collecting electrode (or a grid electrode) in order to effectively collect the electric current; reference numeral 24(a) a power output terminal of positive polarity; reference numeral 24(b) a power output terminal of negative polarity; and reference numeral 25 an electrical connection means.

The solar cell element shown in FIGS. 5(A) and 5(B) comprises the back reflecting layer 20, the semiconductor photoactive layer 21, the transparent and conductive layer 22, and the collecting electrode 23 disposed in the named order on the electrically conductive substrate 19, wherein the output terminal 24(a) is electrically connected to the collecting electrode 23 by means of the electrical connection means 25 and extends from the collecting electrode while being insulated by means of an insulating member (not shown), and the output terminal 24 (b) is electrically connected to the electrically conductive substrate 19 by means of the electrical connection means 25. In this configuration, the positive side power output terminal and the negative side power output terminal may be changed into a negative side power output terminal and a positive side power output terminal, depending upon the constitution of the semiconductor photoactive layer.

In general, there are provided a plurality of solar cell elements having the above constitution, and they are integrated in series connection or in parallel connection depending upon the desired voltage or electric current.

Solar Cell Module

For the solar cell module according to the present invention, it is essential to have a front surface covering material for covering and protecting the solar cell element and which comprises at least a light transmissive sealing resin and a light transmissive surface protective film situated on the outermost surface while contacting said light transmissive sealing resin as previously described. Other than this, there is no particular limitation.

However, the solar cell module according to the present invention is desired to be prepared by way of a thermocompression process in which a stacked body containing a solar cell element, the above light transmissive sealing resin, and light transmissive front surface protective film is thermocompressed while making the light transmissive sealing resin serve as an adhesive to integrally seal the solar cell element with the light transmissive sealing resin and light transmissive front surface protective film. During this thermocompression process, the formation of a desired display pattern may be desirably conducted on a surface of the stacked body as previously described.

As previously described, by disposing a back face reinforcing member made of a metal at the rear side of the solar cell module, the strength of the solar cell module is improved so that the solar cell module can be used for various purposes. For instance, by subjecting the solar cell module to bending processing to make the solar cell module have opposite bent end potions, the solar cell module may be converted into a roof type solar cell module which can be employed in a batten-seam roof construction.

In the following, description will be made of each of the light transmissive sealing resin, light transmissive surface protective film, and back face reinforcing member.

Light Transmissive Sealing Resin

The light transmissive sealing resin serves to enclose the solar cell element to protect the solar cell element from being influenced by external factors such as temperature changes and/or humidity changes in the environment, externally applied impacts, or the like and to attain sufficient adhesion between the solar cell element and the front surface protective film. Hence, the light transmissive sealing resin is required to have thermoplasticity and excel in weatherability, adhesion, packing property, heat resistance, and impact resistance.

Light transmissive resins which meet these requirements include EVA (ethylene-vinyl acetate copolymer), polyvinyl butyral resins, silicone resins, and the like.

Light Transmissive Front Surface Protective Film

The front surface protective film is positioned at the outermost surface of the solar cell module and because of this, it is required to excel in transparency, weatherability, water repellency, heat resistance, pollution resistance, and physical strength. In addition, in the case where the solar cell module is used outdoors under severe environmental conditions, it is required for the front surface protective film to ensure that the solar cell module is of sufficient durability upon repeated use over a long period of time. Further, the surface protective film is desired to have an extensibility degree of 250% or above in order to prevent the occurrence of a rupture or crack at the surface protective film. When the extensibility degree is less than 250%, a crack is liable to occur at the front surface protective film upon bending the solar cell module.

Films usable as the light transmissive front surface protective film can include fluororesin films and the like.

Back Face Reinforcing Member

In the present invention, the back face reinforcing member is not essential but it is optionally used depending upon the application. Particularly, it is possible to dispose the back face reinforcing member at the rear face of the solar cell module in order to improve the mechanical strength thereof and in order to provide the solar cell module with flexibility. In any case, the back face reinforcing member is desired to excel in weatherability and in bending properties. Particularly, it is desired to comprise a metallic member which has a long-term use reliability when used as a metal roof member.

Specific examples are galvanized steel members (or Zn-plated steel members), steel members layered with a weather-resistant material such as fluororesin or vinyl chloride, and stainless steel members.

Now, in the present invention, in order to form a patterned surface region for instance in the form of an uneven shape, an appropriate method must be employed. However, it is desired to employ a method wherein a solar cell module according to the present invention is prepared by way of a thermocompression process wherein a stacked body containing the solar cell element, the above light transmissive sealing resin, and light transmissive front surface protective film is thermocompressed while making the light transmissive sealing resin serve as an adhesive to integrally seal the solar cell element with the light transmissive surface protective film and during this thermocompression process, the formation of a desired display pattern is conducted on a surface of the stacked body as previously described.

Particularly, upon subjecting a stacked body comprising the light transmissive sealing resin, the solar cell element, the light transmissive sealing resin, and the light transmissive front surface protective film formed on the mounting table of the laminator to the thermocompression treatment, by arranging a display-forming member comprising one or more character patterns made of a steel plate or the like on a predetermined area of the surface of the stacked body or/and by laminating an uneven surface-forming member such as a metal mesh member, it is possible to efficiently produce a solar cell module having a desired display pattern on the surface of the light receiving face according to the present invention at a reasonable production cost.

For the uneven surface-forming member, there may be used any uneven surface-forming member as long as it is satisfactory in heat resistance, durability, and flexibility. Preferable examples of such uneven surface-forming member are metal mesh members made of aluminum or stainless steel, nonwoven glass fiber members, woven glass fiber members, nonwoven organic resin fiber members, and woven organic resin fiber members. Besides these, organic resin films and metal thin plates are also usable depending upon the application.

In the following, the present invention will be described in more detail with reference to examples, which are not intended to restrict the scope of the present invention.

EXAMPLES 1 AND 2 AND COMPARATIVE EXAMPLES 1 AND 2

Example 1

In this example, there were prepared ten solar cell modules having the configuration shown in FIGS. 3 and 4, each having an uneven surface provided with a number of minute irregularities and which is provided with a display region of "XYZ012" in a given area thereof.

Particularly, as previously described, the solar cell module shown in FIGS. 3 and 4 comprises a solar cell element 2 enclosed by a light transmissive sealing resin 5, a light transmissive front surface protective film 4 laminated on the light transmissive sealing resin 5 situated on the light receiving front face of the solar cell element 2, and a back face reinforcing member 3 laminated on the light transmissive sealing resin 5 situated on the rear face of the solar cell element 2. The solar cell module shown in FIGS. 3 and 4 has an uneven surface region 8 formed in the surface protective film 4, which is provided with a display region 7 of "XYZ012" at a desired position of said uneven surface region. This solar cell module is provided with a frame 6 which serves to improve the structural strength of the solar cell module and also to enable the solar cell module to be readily installed on a support table or a roof of a building.

Each solar cell module was prepared in the following manner, using the lamination instrument shown in FIG. 6 and in accordance with the thermocompression treatment procedures shown in FIG. 7 for the preparation of a solar cell module.

First, there were provided an amorphous silicon solar cell element comprising 5 amorphous silicon photovoltaic elements of 400 mm×250 mm in size and having the constitution shown in FIGS. 5(A) and 5(B) integrated in series connection on a stainless steel substrate as the solar cell element 2; two 900 μm thick EVA sheets having a size greater than that of the solar cell element 2 as the light transmissive sealing resin 5; a 50 μm thick nonoriented fluororesin film (trademark name: TEFZEL, produced by Du Pont Company) having a size greater than that of the solar cell element 2 as the front surface protective film 4; a 0.4 mm thick galvanized steel plate (trademark name: TIMER-COLOR GL, produced by Daidokohan Kabushiki Kaisha) of 450 mm×1300 mm in size as the back face reinforcing member 3; a display-forming member (shown by the numeral reference 32 in FIG. 7) comprising six character patterns of X, Y, Z, 0, 1, and 2, respectively formed of a 0.6 mm thick stainless steel plate wherein each character pattern has a predetermined small size; and an aluminum mesh member (shown by the numeral reference 33 in FIG. 7) of 16×18 in mesh size and 0.011 inch in linear diameter and having a size greater than that of the fluororesin film.

On the surface of the mounting table of the lamination instrument 26 (shown in FIG. 6), a Teflon (trademark name) film as the release member 31 was laid. On the surface of the release member 31, there were laminated the galvanized steel plate 3, the EVA sheet 5, the solar cell 2, the EVA sheet 5, and the fluororesin film 4 in the named order to form a laminate situated on the release member 31.

Then, the six character patterns as the display-forming member were spacedly arranged on and laminated on a predetermined area of the front surface of the fluororesin film 4, followed by laminating the aluminum mesh member so as to cover the surface of the fluororesin film 4 of the laminate, thereby forming a stacked body situated on the release member 31. Next, a silicone rubber sheet as the covering member 34 was superposed on the stacked body so as to enclose the stacked body.

Thereafter, the vacuum pump having a performance of 150 L/min in terms of pumping speed (not shown) was operated to evacuate the space containing the stacked body between the mounting table having the release member 31 laid thereon and the covering member 34 for about 10 minutes until the reading on the vacuum gage (not shown) positioned in the vicinity of the vacuum pump became less than 3 Torr. Thereafter, while continuing the vacuuming operation by the vacuum pump, the lamination instrument was introduced into a furnace (not shown), and the furnace was closed while leaving the exhaust pipe connected to the vacuum pump of the lamination instrument. The open spacing remaining without having been closed due to the exhaust pipe was sealed by means of a sealing member in order to prevent hot air in the furnace from leaking to the outside. The inside of the furnace was previously adjusted to 150° C. before the introduction of the lamination instrument therein. The stacked body in the lamination instrument was subjected to heat treatment for 70 minutes in the furnace.

After the heat treatment of the stacked body in the lamination instrument in the furnace, while continuing the vacuuming operation by the vacuum pump, the lamination instrument was taken out from the furnace, followed by air-cooling to about room temperature. Then, the operation of the vacuum pump was terminated. Thereafter, the covering member 34 was removed, and the treated stacked body was taken out from the lamination instrument. The treated stacked body was found to have projections comprising the EVA resin and fluororesin. The projections were cut along the end sides of the back face reinforcing member 3. And the six character patterns and the aluminum mesh member of the resultant were removed. Thus, there was obtained a solar cell module.

In this way, there were obtained ten solar cell modules (hereinafter referred to as solar cell module sample group No. 1).

The surface state of each of the resultant ten solar cell modules was examined. As a result, each solar cell module was found to have an uneven surface provided with a multiplicity of minute irregularities based on the aluminum mesh member and which contains a display region comprising a recess shaped in an "X" form, a recess shaped in a "Y" form, a recess shaped in a "Z" form, a recess shaped in a "0" form, a recess shaped in a "1" form and a recess shaped in a "2" form based on the six stainless steel patterns spacedly arranged within a limited area of the uneven surface.

Example 2

In this example, there were prepared ten solar cell modules having a partially modified configuration of the configuration shown in FIGS. 3 and 4, each having an uneven surface provided with a number of minute irregularities and provided with a display region of "XYZ012" extended in an entire area thereof.

Each solar cell module was prepared by repeating the procedures of Example 1, except that the thermocompression treatment procedure shown in FIG. 7 employed in Example 1 was changed to the thermocompression procedure shown in FIG. 8 for the preparation of a solar cell module. Specifically, the display-forming member (shown by reference numeral 32 in FIG. 7) used in Example 1 was replaced by an enlarged display-forming member (shown by the reference numeral 32 in FIG. 8) comprising six character patterns of X, Y, Z, 0, 1, and 2, respectively formed of a 0.6 mm thick stainless steel plate, wherein each character pattern has a predetermined large size capable of being placed within the surface area of the solar cell module. Particularly in this respect, in the step of arranging and laminating the six character patterns as the display-forming member on the surface of the fluororesin film 4 of the laminate in Example 1, the above large-sized six character patterns were spacedly arranged on and laminated on the entire surface of the fluororesin film 4 of the laminate.

In this way, there were obtained ten solar cell modules (hereinafter referred to as solar cell module sample group No. 2).

The surface state of each of the resultant ten solar cell modules was examined. As a result, each solar cell module was found to have an uneven surface provided with a plurality of minute irregularities based on the aluminum mesh member and which contains a display region comprising a large recess shaped in an "X" form, a large recess shaped in a "Y" form, a large recess shaped in a "Z" form, a large recess shaped in a "0" form, a large recess shaped in a "1" form and a large recess shaped in a "2" form based on the six large-sized stainless steel patterns spacedly arranged in the uneven surface.

Comparative Example 1

In this comparative example, there were prepared ten solar cell modules having an uneven front surface provided with a multiplicity of minute irregularities but not provided with a display region of "XYZ012".

Figure 9:
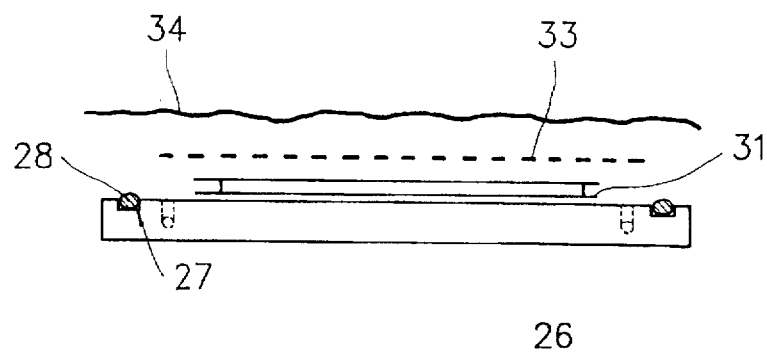

Each solar cell module was prepared by repeating the procedures of Example 1, except that the thermocompression treatment procedure shown in FIG. 7 employed in Example 1 was changed to the thermocompression procedure shown in FIG. 9 for the preparation of a solar cell module. Specifically, the display-forming member (shown by the numeral reference 32 in FIG. 7) used in Example 1 was not used. Particularly in this respect, the step of arranging and laminating the six character patterns as the display-forming member on the surface of the fluororesin film 4 of the laminate in Example 1 was not conducted.

In this way, there were obtained ten solar cell module (hereinafter referred to as solar cell module sample group No. 3).

The surface state of each of the resultant ten solar cell modules was examined. As a result, each solar cell module was found to have an uneven surface provided with a multiplicity of minute irregularities based on the aluminum mesh member.

Comparative Example 2

In this comparative example, there were prepared ten solar cell modules having a planar front surface provided with neither minute irregularities nor a display region of "XYZ012".

Figure 10:
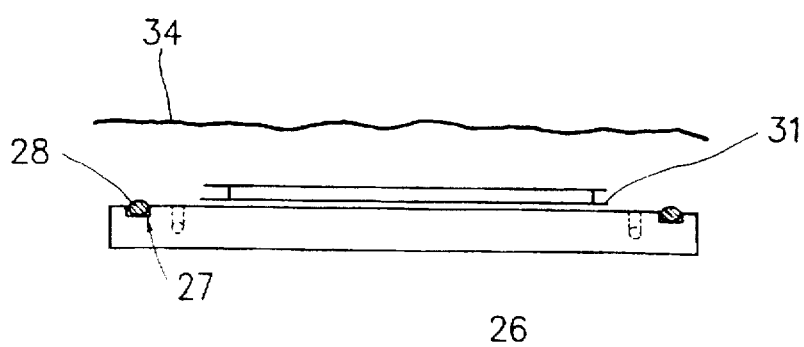

Each solar cell module was prepared by repeating the procedures of Example 1, except that the thermocompression treatment procedure shown in FIG. 7 employed in Example 1 was changed to the thermocompression procedure shown in FIG. 10 for the preparation of a solar cell module. Specifically, both the display-forming member (shown by the reference numeral 32 in FIG. 7) and the aluminum mesh member (shown by the numeral reference 33 in FIG. 7) used in Example 1 were not used. Particularly in this respect, the steps of arranging and laminating the six character patterns as the display-forming member and laminating the aluminum mesh member on the front surface of the fluororesin film 4 of the laminate in Example 1 were not conducted.

In this way, there were obtained ten solar cell modules (hereinafter referred to as solar cell module sample group No. 4).

The surface state of each of the resultant ten solar cell modules was examined. As a result, each solar cell module was found to have an even front surface with no irregularities, because the silicone rubber sheet as the covering member 34 had a polished even surface in contact with the surface of the fluororesin film 4.

Evaluation (1). For the solar cell module sample group Nos. 1 to 4 obtained in Examples 1 and 2 and Comparative Examples 1 and 2, evaluation was conducted with respect to initial power generation performance in terms of generated output.

The evaluation of the power generation performance was conducted for each of the ten solar cell modules of each solar cell module sample group in the following manner.

That is, each solar cell module was placed in a solar simulator SPI-SUN SIMULATOR 240A (trademark name, produced by SPIRE Company) capable of automatically measuring a power output when the solar cell element of the solar cell module is actuated in an optimum state to provide a maximum power output by subjecting the solar cell module to irradiation of pseudo-sunlight, whereby the initial power generation performance of the solar cell module was evaluated. Particularly, for the ten solar cell modules of each solar cell module sample group, an average generated output, maximum generated output, and minimum generated output respectively per one solar cell module were evaluated.

The results obtained for each solar cell module sample group are collectively shown in Table 1.

Based on the results shown in Table 1, the following are understood. That is, for the average generated output per one solar cell module, the solar cell module sample group No. 1 is 34.19 W, the solar cell module sample group No. 2 is 34.23 W, the solar cell module sample group No. 3 is 34.25 W, and the solar cell module sample group No. 4 is 34.27 W. And for the maximum generated output per one solar cell module, all the solar cell module sample group Nos. 1 to 4 are of about 34.5 W and for the minimum generated output per one solar cell module, all of them are about 33.9 W, wherein the difference between the maximum generated output and the minimum generated output is about 0.6 W. Hence, it is understood that there is no distinguishable difference among the solar cell module sample group Nos. 1 to 4.

(2). Each of the ten solar cell modules of each of the solar cell module sample groups Nos. 1 to 4 was used outdoors for power generation for one year. Thereafter, each solar cell module was evaluated with respect to power generation performance using the above solar simulator. Particularly, for the ten solar cell modules of each solar cell module sample group, an average generated output, maximum generated output, and minimum generated output respectively per one solar cell module were evaluated.

The results obtained for each solar cell module sample group are collectively shown in Table 2.

Based on the results shown in Table 2, the following are understood. That is, for the average generated output per one solar cell module, the solar cell module sample group No. 1 is 29.67 W, the solar cell module sample group No. 2 is 29.74 W, the solar cell module sample group No. 3 is 29.71 W, and the solar cell module sample group No. 4 is 29.76 W. And for the maximum generated output per one solar cell module, all the solar cell module sample group Nos. 1 to 4 are of about 30.1 W and for the minimum generated output per one solar cell module, all of them are about 29.5 W, wherein the difference between the maximum generated output and the minimum generated output is about 0.6 W.

Hence, it is understood that there is no distinguishable difference among the solar cell module sample group Nos. 1 to 4.

In conclusion, it is understood that there is no distinguishable difference among the solar cell module sample group Nos. 1 to 4 in terms of not only their initial power generation performance but also their power generation performance after having been deteriorated.

Now, all the solar cell modules of the solar cell module sample group Nos. 1 to 4 are of the same light receiving surface area. The power generation efficiency of each of these solar cell modules is evaluated based on its light receiving face area. Hence, the above results of the generated output can be used as they are in the evaluation of the power generation efficiency. In this connection, it is understood that there is no distinguishable difference among the solar cell module sample group Nos. 1 to 4 in terms of their power generation efficiency.

Based on the above described facts, it is understood that when a region shaped to form a desired character or designation and another region shaped in a form different from that of said region are formed in the surface of a front surface covering material comprising a light transmissive sealing resin and a light transmissive surface protective film of a solar cell module, such that one is situated next to the other as described in Examples 1 and 2, no practically problematic reduction is caused in the power generation efficiency.

Example 3

Figure 11:
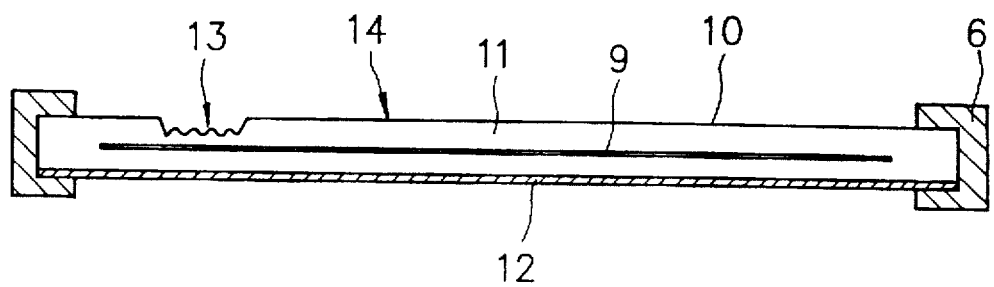
FIG. 11 is a schematic cross-sectional view illustrating another example of a solar cell module according to the present invention.

In this example, there was prepared a solar cell module having the configuration shown in FIG. 11.

FIG. 11 is a schematic cross-sectional view illustrating an example of a solar cell module having a surface provided with (a) an uneven surface region having a display of "XYZ012" and (b) a planar surface region situated next to the uneven surface region (a), according to the present invention.

The solar cell module shown in FIG. 11 comprises a solar cell element 9 enclosed by a light transmissive sealing resin 11, a front surface protective film 10 laminated on the light transmissive sealing resin 11 situated on the light receiving front face of the solar cell element 9, and a back face reinforcing member 12 laminated on the light transmissive sealing resin 11 situated on the rear face of the solar cell element 9. The solar cell module shown in FIG. 11 has a surface provided with an uneven surface region 13 serving to form a display of "XYZ012" and a planar surface region 14 situated next to the uneven surface region 13. The uneven surface region 13 comprises a recess having an internal surface provided with a plurality of minute irregularities, which is situated in a desired area of the front surface of the solar cell module.

Reference numeral 6 indicates a frame which is fixed to the solar cell module in order to improve the structural strength of the solar cell module and also in order to enable the solar cell module to be readily installed on a support table or a roof of a building.

In this example, the solar cell module having the configuration shown in FIG. 11 was prepared in the following manner, using the lamination instrument shown in FIG. 6 and in accordance with the thermocompression procedures shown in FIG. 7 (excluding the step of laminating the mesh member 33) for the preparation of a solar cell module.

First, there were provided an amorphous silicon solar cell element comprising 5 amorphous silicon photovoltaic elements of 400 mm×250 mm in size and having the constitution shown in FIGS. 5(A) and 5(B) integrated in series connection on a stainless steel substrate as the solar cell element 9; two 900 μm thick EVA sheets having a size greater than that of the solar cell element 9 as the light transmissive sealing resin 11; a 50 μm thick nonoriented fluororesin film (trademark name: TEFZEL, produced by Du Pont Company) having a size greater than that of the solar cell element 9 as the front surface protective film 10; a 0.4 mm thick galvanized steel plate (trademark name: TIMER-COLOR GL, produced by Daidokohan Kabushiki Kaisha)

of 450 mm×1300 mm in size as the back face reinforcing member 12; and a display-forming member comprising six character patterns of X, Y, Z, 0, 1, and 2, respectively formed of a stainless steel mesh member of 16×16 in mesh size and 0.27 mm in linear diameter.

On the surface of the mounting table of the lamination instrument 26, a Teflon (trademark name) film was laid as the release member 31. On the surface of the release member 31, there were laminated the galvanized steel plate 12, the EVA sheet 11, the solar cell 9, the EVA sheet 11, and the fluororesin film 10 in the named order to form a laminate.

Then, the six character patterns as the display-forming member were spacedly arranged on and laminated on a predetermined area of the front surface of the fluororesin film 10 of the laminate to form a stacked body situated on the release member 31. Next, a silicone rubber sheet having a polished even surface to be contacted with the surface of the stacked body as the covering member 34 was superposed on the stacked body so as to enclose the stacked body.

Thereafter, the vacuum pump having a performance of 150 L/min in terms of pumping speed (not shown) was operated to evacuate the space containing the stacked body between the mounting table having the release member 31 laid thereon and the covering member 34 for about 10 minutes until the reading on the vacuum gage (not shown) positioned in the vicinity of the vacuum pump became less than 3 Torr. Thereafter, while continuing the vacuuming operation of the vacuum pump, the lamination instrument was introduced into a furnace (not shown), and the furnace was closed while leaving the exhaust pipe (connected to the vacuum pump) of the lamination instrument. The spacing remaining without having been closed off due to the exhaust pipe was sealed by means of a sealing member in order to prevent hot air in the furnace from leaking to the outside. The inside of the furnace was previously adjusted to 150° C. before the introduction of the lamination instrument therein. The stacked body in the lamination instrument was subjected to heat treatment for 70 minutes in the furnace, whereby the two EVA sheets 11 were maintained at 150° C. for more than 30 minutes.

This heat treatment for 70 minutes was conducted with due care since it would take about 40 minutes until the temperature of the stacked body in the lamination instrument reached 150° C.

The above heat treatment conditions had been determined as a result of experimental studies by the present inventors. Further, the above heat treatment conditions are based on the fact that in order for an EVA resin to chemically change into a state exhibiting adhesion, the EVA resin is necessary to be maintained at 150° C. for more than 30 minutes.

Now, after the foregoing heat treatment of the stacked body in the lamination instrument in the furnace, while continuing the vacuuming operation by the vacuum pump, the lamination instrument was taken out from the furnace, followed by air-cooling to about room temperature. Then, the operation of the vacuum pump was terminated. Thereafter, the covering member 34 was removed, and the treated stacked body was taken out from the lamination instrument. The treated stacked body was found to have protrusions comprising the EVA resin and fluororesin. The protrusions were cut along the end sides of the back face reinforcing member 12, and the six character patterns of the resultant were removed. Thus, there was obtained a solar cell module.

The surface state of the resultant solar cell module was examined. As a result, the solar cell module was found to have a surface having a display region 13 comprising a recessed surface provided with a plurality of minute irregularities and which contains a recess shaped in an "X" form, a recess shaped in a "Y" form, a recess shaped in a "Z" form, a recess shaped in a "0" form, a recess shaped in a "1" form, and a recess shaped in a "2" form based on the six stainless steel mesh member patterns arranged in a limited area of the front surface and a planar front surface region 14 situated next to the display surface region 13. And it was found that the presence of the two different surface regions 13 and 14 enables one to distinguish the display of "XYZ012" on the surface of the solar cell module.

Hence, it is understood that making a solar cell module having a surface provided with two different front surface regions as shown in FIG. 11 enables formation of a desired display which can be distinguished.

The resultant solar cell module was evaluated with respect to power generation performance in accordance with the foregoing power generation performance evaluation method. As a result, the solar cell module was found to be satisfactory in the power generation performance.

Example 4

Figure 12:
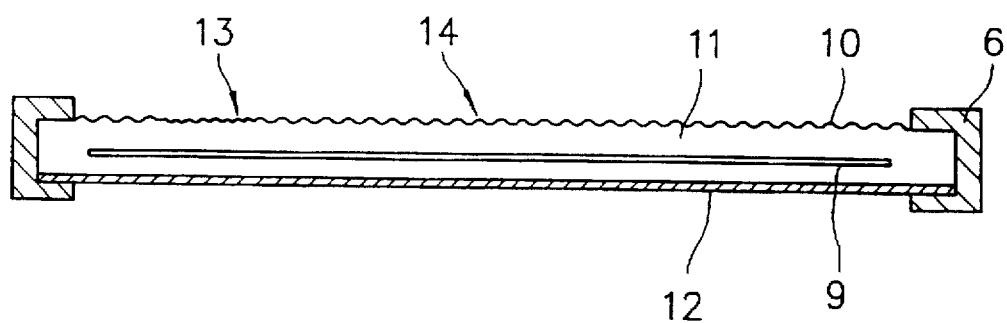
FIG. 12 is a schematic cross-sectional view illustrating a further example of a solar cell module according to the present invention.

In this example, there was prepared a solar cell module having the configuration shown in FIG. 12.

FIG. 12 is a schematic cross-sectional view illustrating an example of a solar cell module having a front surface provided with (a) an uneven surface region providing a display of "XYZ012" and (b) another uneven surface region situated next to the uneven surface region (a), according to the present invention, wherein the magnitude of the unevenness of the uneven surface region (a) is different from that of the uneven surface region (b).

The solar cell module shown in FIG. 12 comprises a solar cell element 9 enclosed by a light transmissive sealing resin 11, a front surface protective film 10 laminated on the light transmissive sealing resin 11 situated on the light receiving front face of the solar cell element 9, and a back face reinforcing member 12 laminated on the light transmissive sealing resin 11 situated on the rear face of the solar cell element 9. The solar cell module shown in FIG. 12 has a surface provided with an uneven surface region 13 forming a display of "XYZ012" and another uneven surface region 14 situated next to the uneven surface region 13. The uneven surface region 13 comprises an uneven region provided with a number of minute irregularities of about 50 μm in average difference of elevation. The uneven surface region 14 comprises a region provided with a number of minute irregularities of about 500 μm in average difference of elevation.

Reference numeral 6 indicates a frame which is fixed to the solar cell module in order to improve the structural strength of the solar cell module and also in order to enable the solar cell module to be readily installed on a support table or a roof of a building.

In this example, the solar cell module having the configuration shown in FIG. 12 was prepared in the following manner, using the lamination instrument shown in FIG. 6 and in accordance with the thermocompression procedures shown in FIG. 7 for the preparation of a solar cell module.

First, there were provided an amorphous silicon solar cell element comprising 5 amorphous silicon photovoltaic elements of 400 mm×250 mm in size and having the constitution shown in FIGS. 5(A) and 5(B) integrated in series connection on a stainless steel substrate as the solar cell element 9; two 900 μm thick EVA sheets having a size greater than that of the solar cell element 9 as the light transmissive sealing resin 11; a 50 μm thick nonoriented fluororesin film (trademark name: TEFZEL, produced by Du Pont Company) having a size greater than that of the solar cell element 9 as the front surface protective film 10; a 0.4 mm thick galvanized steel plate (trademark name: TIMER-COLOR GL, produced by Daidokohan Kabushiki Kaisha) of 450 mm×1300 mm as the back face reinforcing member 12; a display-forming member comprising six character patterns of X, Y, Z, 0, 1, and 2, respectively formed of a 150 μm thick PET film; and a stainless steel mesh member of 16×16 in mesh size and 0.27 mm in linear diameter and having a size greater than that of the fluororesin film 10.

On the surface of the mounting table of the lamination instrument 26, a Teflon (trademark name) film was laid as the release member 31. On the surface of the release member 31, there were laminated the galvanized steel plate 12, the EVA sheet 11, the solar cell 9, the EVA sheet 11, and the fluororesin film 10 in the named order to form a laminate.

Then, the six character patterns as the display-forming member were spacedly arranged and laminated on a predetermined area of the front surface of the fluororesin film 10 of the laminate, followed by laminating the stainless steel mesh member so as to cover the front surface of the fluororesin film 10 of the laminate, thereby forming a stacked body situated on the release member 31. Next, a silicone rubber sheet as the covering member 34 was superposed on the stacked body so as to enclose the stacked body.

Thereafter, the vacuum pump having a performance of 150 L/min in terms of pumping speed (not shown) was operated to evacuate the space containing the stacked body between the mounting table having the release member 31 laid thereon and the covering member 34 for about 10 minutes until the reading on the vacuum gage (not shown) positioned in the vicinity of the vacuum pump became less than 3 Torr. Thereafter, while continuing the vacuuming by the vacuum pump, the lamination instrument was introduced into a furnace (not shown), where the furnace was closed while leaving the exhaust pipe (connected to the vacuum pump) of the lamination instrument. The spacing remaining without having been closed off due to the exhaust pipe was sealed by means of a sealing member in order to prevent hot air in the furnace from leaking to the outside. The inside of the furnace was previously adjusted to 150° C. before the introduction of the lamination instrument therein. The stacked body in the lamination instrument was subjected to heat treatment in the furnace for 70 minutes.

After the heat treatment of the stacked body in the lamination instrument in the furnace, while continuing the vacuuming by the vacuum pump, the lamination instrument was taken out from the furnace, followed by air-cooling to about room temperature. Then, the operation of the vacuum pump was terminated. Thereafter, the covering member 34 was removed, and the treated stacked body was taken out from the lamination instrument. The treated stacked body was found to have protrusions comprising the EVA resin and fluororesin. The protrusions were cut along the end sides of the back face reinforcing member 12, and the six character patterns and the stainless steel mesh member of the resultant were removed. Thus, there was obtained a solar cell module.

The surface state of the resultant solar cell module was examined. As a result, the solar cell module was found to have an uneven surface region 13 provided with a multiplicity of minute irregularities and containing a display region comprising a recess shaped in an "X" form, a recess shaped in a "Y" form, a recess shaped in a "Z" form, a recess shaped in a "0" form, a recess shaped in a "1" form, and a recess shaped in a "2" form based on the six PET film patterns arranged in the uneven surface region 13 and another uneven surface region 14 provided with a plurality of minute irregularities which is situated next to the uneven surface region 13.

The magnitude of the unevenness of each of the two uneven surface regions was examined. As a result, the magnitude of the unevenness of the uneven surface region 13 was found to be about 50 μm in terms of average difference of elevation, and the magnitude of the unevenness of the uneven surface region 14 was found to be about 500 μm in terms of average difference of elevation. For the reason why the unevenness magnitude of the uneven surface region 13 is smaller than that of the uneven surface region 14, it is considered that the pressing force of the stainless steel mesh member at the position where the PET film patterns were present was relaxed to provide said uneven surface region having a plurality of minute irregularities having a small average difference of elevation.

It was found that the presence of the two different surface regions enables one to distinguish the display of "XYZ012" on the surface of the solar cell module.

Hence, it is understood that making a solar cell module to have a surface provided with two different surface regions as shown in FIG. 12 enables forming of a desired display which can be distinguished.

The resultant solar cell module was evaluated with respect to power generation performance in accordance with the foregoing power generation performance evaluation manner. As a result, the solar cell module was found to be satisfactory in power generation performance.

Example 5

Figure 13:
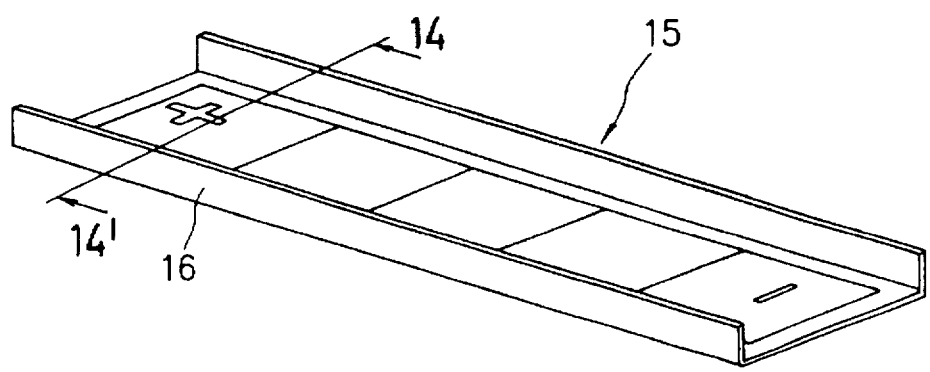
FIG. 13 is a schematic view illustrating a further example of a solar cell module according to the present invention, viewed from the light receiving face side.
Figure 14:
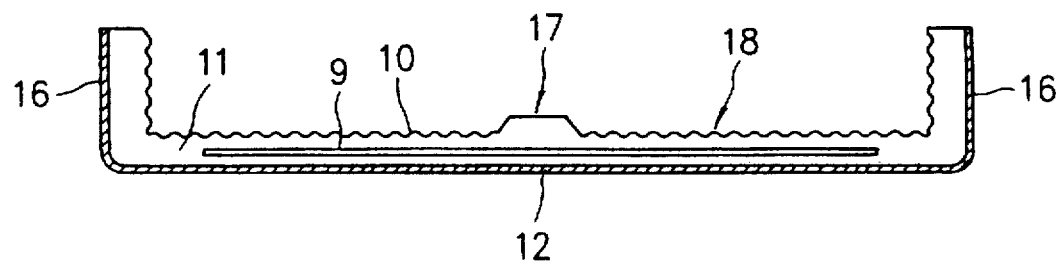
FIG. 14 is a schematic cross-sectional view, taken along the line 14-14' in FIG. 13.

In this example, there was prepared a solar cell module having the configuration shown in FIGS. 13 and 14, which is capable of being used as a roof member in a batten-seam construction.

FIG. 13 is a schematic view illustrating an example of a solar cell module 15 having opposite bent end portions 16, for instance at an angle of 90°, so that it can be used as a roof member of a building, wherein the solar cell module has an uneven front surface provided with a display region of "+" to indicate a positive output terminal side of a solar cell element enclosed in the solar cell module and a display region of "−" to indicate a negative output terminal side of a solar cell element enclosed in said module.

FIG. 14 is a schematic cross-sectional view, taken along the line 14-14 ' in FIG. 13.

Particularly, the solar cell module shown in FIGS. 13 and 14 has an uneven front surface provided with (a) a surface region forming a display of "+" positioned at one end portion of the uneven surface under which a solar cell element 9 is present and (b) a surface region forming a display of "−" positioned in the other end portion of the uneven surface under which a solar cell element 9 is present, wherein the display surface region (a) comprises a protrusion 17 shaped in a "+" form situated in an uneven region 18 provided with a plurality of minute irregularities and the display surface region (b) comprises a protrusion 17 shaped in a "−" form situated in the uneven region 18. As shown in FIG. 14, each bent portion 16 comprises a solar cell-free portion of the solar cell module.

In more detail, the solar cell module shown in FIGS. 13 and 14 comprises a single body having an uneven surface 18 provided with a plurality of minute irregularities and which comprises a flat portion having a solar cell element 9 enclosed therein which is situated between opposite bent end portions 16 in which no solar cell is present, wherein the flat portion of the single body comprises said solar cell element 9 enclosed by a light transmissive sealing resin 11, a front surface protective film 10 laminated on the light transmissive sealing resin 11 situated on the light receiving face of the solar cell element 9, and a back face reinforcing member 12 laminated on the light transmissive sealing resin 11 situated on the rear face of the solar cell 9 element, and each of the opposite bent end portions 16 comprises a solar cell-free extended portion of the flat portion. The uneven surface 18 of said single body is formed in the surface protective film 10. And the uneven surface 18 of the flat portion of the single body contains (a) a surface region comprising a protrusion 17 shaped in a "+" form positioned in one end portion of the uneven surface of the flat portion under which the solar cell element 9 is present and (b) a display surface region comprising a protrusion 17 shaped in a "−" form positioned in the other end portion of the uneven surface of the flat portion under which the solar cell element 9 is present.

In this example, the solar cell module having the configuration shown in FIGS. 13 and 14 was prepared in the following manner, using the lamination instrument shown in FIG. 6 and in accordance with the thermocompression treatment procedures shown in FIG. 8 for the preparation of a solar cell module.

First, there were provided an amorphous silicon solar cell element comprising 5 amorphous silicon photovoltaic elements of 400 mm×250 mm in size and having the constitution shown in FIGS. 5(A) and 5(B) integrated in series connection on a stainless steel substrate as the solar cell element 9; two 900 µm thick EVA sheets having a size greater than that of the solar cell element 9 as the light transmissive sealing resin 11; a 50 µm thick nonoriented fluororesin film (trademark name: TEFZEL, produced by Du Pont Company) having a size greater than that of the solar cell element 9 as the front surface protective film 10; a 0.4 mm thick galvanized steel plate (trademark name: TIMER-COLOR GL, produced by Daidokohan Kabushiki Kaisha) having a size greater than that of the solar cell element 9 as the back face reinforcing member 12; and a stainless steel mesh member of 16×16 in mesh size and 0.27 mm in linear diameter and having a broken pattern in the form of a "+" shape for forming the display of "+" and another broken pattern in the form of a "−" shape for forming the display of "−". The stainless steel mesh member was made to have a size greater than that of the solar cell element 9.

On the surface of the mounting table of the lamination instrument 26, a Teflon (trademark name) film was laid as the release member 31. On the surface of the release member 31, there were laminated the galvanized steel plate 12, the EVA sheet 11, the solar cell 9, the EVA sheet 11, and the fluororesin film 10 in the named order to form a laminate.

Then, the stainless steel member was laminated on the surface of the fluororesin film 10 of the laminate so as to cover the entire of the surface of the fluororesin film 10 of the laminate to form a stacked body situated on the release member 31. Next, a silicone rubber sheet as the covering member 34 was superposed on the stacked body so as to enclose the stacked body.

Thereafter, the vacuum pump having a performance of 150 L/min in terms of pumping speed (not shown) was operated to evacuate the space containing the stacked body between the mounting table having the release member 31 laid thereon and the covering member 34 for about 10 minutes until the reading on the vacuum gage (not shown) positioned in the vicinity of the vacuum pump became less than 3 Torr. Thereafter, while continuing the vacuuming, the lamination instrument was introduced into a furnace (not shown), and the furnace was closed while leaving the exhaust pipe (connected to the vacuum pump) of the lamination instrument. The spacing remaining without having been closed off due to the exhaust pipe was sealed by means of a sealing member in order to prevent hot air in the furnace from leaking to the outside. The inside of the furnace was adjusted to 150° C. before the introduction of the lamination instrument therein. The stacked body in the lamination instrument was subjected to heat treatment for 70 minutes in the furnace.

After the heat treatment of the stacked body in the lamination instrument in the furnace, while continuing the vacuuming, the lamination instrument was taken out from the furnace, followed by air-cooling to about room temperature. Then, the operation of the vacuum pump was terminated. Thereafter, the covering member 34 was removed, and the treated stacked body was taken out from the lamination instrument, and the stainless steel mesh member of the resultant was removed. Thus, there was obtained a solar cell module. For the resultant solar cell module, its opposite end portions with no solar cell element were bent at an angle of 90° to form opposite bent end portions 16 for the solar cell module.

The resultant solar cell module was found to have a configuration as shown in FIG. 13 in that the flat portion having the solar cell element enclosed therein and the opposite bent end portions have a common uneven surface provided with a multiplicity of minute irregularities and the uneven surface of the flat portion contains a display region comprising a protrusion 17 shaped in a "+" form positioned in one end portion of the uneven surface under which a solar cell element is present and another display region comprising a protrusion 17 shaped in a "−" form positioned in the other end portion of the uneven surface under which a solar cell element is present.

And it was found that the presence of the uneven surface region containing the display of "+" and the display of "−" arranged therein enables one to distinguish each display.

Hence, it is understood that to make a solar cell module having a configuration such as shown in FIGS. 13 and 14 enables forming a display of "+" or "−" which can be distinguished.

The resultant solar cell module was evaluated with respect to power generation performance in accordance with the foregoing power generation performance evaluation method. As a result, the solar cell module was found to be satisfactory in power generation performance.

From the above description, the following are understood. According to the present invention, it is possible to readily form a display of a desired character or designation, which can be readily distinguished, on the light receiving face of a solar cell module. The present invention enables one to efficiently produce a solar cell module having a surface provided with a display of a desired character or designation which has a satisfactory power generation performance at a reasonable production cost. In addition, the present invention enables one to efficiently produce a solar cell module having a surface provided with a display having a positive terminal side and a negative terminal side which can be readily distinguished on the light receiving face and therefore, which markedly diminishes the work load during installation of the solar cell module.

Further, the solar cell module provided with such display on the light receiving face thereof according to the present invention has such pronounced advantages as will be described in the following. That is, the solar cell module can be readily installed on a roof of a building while readily confirming a given position of the roof at which the solar cell module is to be installed. Particularly in this respect, the solar cell module can be readily installed at a predetermined location of the roof with reference to the display thereof so that the location of the solar cell module on the roof can always be readily and surely distinguished according to the display. Therefore, the solar cell module according to the present invention enables realization of a desired installation and desired electric connection state corresponding to a design specification without entailing confusion in the installation work.

In addition, the solar cell module according to the present invention enables establishment of an indication display of a desired character or designation showing the owner on the light receiving face (which is exposed to the public) in a state such that the display is hardly removable. This situation is effective in terms of burglarproofing.

Further in addition, the solar cell module according to the present invention excels in exterior appearance in view of its design and therefore, it can be desirably used for various purposes, for instance, as a building construction member and the like.

TABLE 1

|  | number of solar cell modules engaged in evaluation | average generated output per one solar cell module | maximum generated output per one solar sell module | minimum generated output per one solar cell module |
| --- | --- | --- | --- | --- |
| Example 1 | 10 | 34.19 | 34.52 | 33.93 |
| Example 2 | 10 | 34.23 | 34.51 | 33.94 |
| Comparative Example 1 | 10 | 34.25 | 34.54 | 33.92 |
| Comparative Example 2 | 10 | 34.27 | 34.52 | 33.95 |

TABLE 2

|  | number of solar cell modules engaged in evaluation | average generated output per one solar cell module | maximum generated output per one solar sell module | minimum generated output per one solar cell module |
| --- | --- | --- | --- | --- |
| Example 1 | 10 | 29.67 | 30.11 | 29.53 |
| Example 2 | 10 | 29.74 | 30.13 | 29.52 |
| Comparative Example 1 | 10 | 29.71 | 30.12 | 29.55 |
| Comparative Example 2 | 10 | 29.76 | 30.15 | 29.51 |

What is claimed is:

1. A solar cell module comprising at least one solar cell element and at least a front surface covering material disposed to cover the light receiving face of said at least one solar cell element, said front surface covering material comprising a light transmissive resin and a light transmissive surface protective film situated on the outermost surface in contact with said light transmissive resin, characterized in that said front surface covering material includes means for forming a desired display pattern on the light receiving face of said at least one solar cell element, said means comprising (a) a patterned surface region forming said desired display pattern and (b) another patterned surface region having a surface pattern which is different from that of said patterned surface region (a), and said patterned surface region (a) and said patterned surface region (b) being situated next to each other.

2. A solar cell module according to claim 1, wherein the patterned surface region (a) comprises a recessed or protruding surface pattern and the patterned surface region (b) comprises a planar surface pattern or an uneven surface pattern provided with a plurality of minute irregularities.

3. A solar cell module according to claim 2, wherein the recessed or protruding surface pattern of the patterned surface region (a) is provided with a plurality of minute irregularities.

4. A solar cell module according to claim 3, wherein the minute irregularities of said recessed or protruding surface pattern of the patterned surface region (a) are different from the minute irregularities of the surface pattern of the patterned surface region (b).

5. A solar cell module according to claim 4, wherein the minute irregularities of the patterned surface region (a) and the minute irregularities of the patterned surface region (b) are formed by means of a sheet-like member having an uneven surface engaged in thermocompression of said light transmissive resin during production of the solar cell module.

6. A solar cell module according to claim 5, wherein the sheet-like member is selected from the group consisting of a mesh member made of aluminum, a mesh member made of stainless steel, a nonwoven glass fiber member, a woven glass fiber member, a nonwoven organic resin fiber member, and a woven organic resin fiber member.

7. A solar cell module according to claim 3, wherein the minute irregularities of the patterned surface region (a) are formed by means of a sheet-like member having an uneven surface engaged in thermocompression of said light transmissive resin during production of the solar cell module.

8. A solar cell module according to claim 7, wherein the sheet-like member is selected from the group consisting of a mesh member made of aluminum, a mesh member made of stainless steel, a nonwoven glass fiber member, a woven glass fiber member, a nonwoven organic resin fiber member, and a woven organic resin fiber member.

9. A solar cell module according to claim 2, wherein the minute irregularities of the patterned surface region (b) are formed by means of a sheet-like member having an uneven surface engaged in thermocompression of said light transmissive resin during production of the solar cell module.

10. A solar cell module according to claim 9, wherein the sheet-like member is selected from the group consisting of a mesh member made of aluminum, a mesh member made of stainless steel, a nonwoven glass fiber member, a woven glass fiber member, a nonwoven organic resin fiber member, and a woven organic resin fiber member.

11. A solar cell module according to claim 1, wherein the patterned surface region (a) forming the desired display pattern comprises an uneven surface provided with a plurality of minute irregularities and the patterned surface region (b) comprises an uneven surface pattern provided with a plurality of minute irregularities.

12. A solar cell module according to claim 1, wherein the minute irregularities of the patterned surface region (a) and the minute irregularities of the patterned surface region (b) are formed by means of a sheet-like member having an uneven surface engaged in thermocompression of said light transmissive resin during production of the solar cell module.

13. A solar cell module according to claim 12, wherein the sheet-like member is selected from the group consisting of a mesh member made of aluminum, a mesh member made of stainless steel, a nonwoven glass fiber member, a woven glass fiber member, a nonwoven organic resin fiber member, and a woven organic resin fiber member.

14. A solar cell module according to claim 1, wherein the desired display pattern which is formed on the light receiving face of the solar cell module is a pattern by which the positive and/or negative output terminal of the solar cell module can be distinguished.

15. A solar cell module according to claim 1, wherein the desired display pattern which is formed on the light receiving face of the solar cell module is a pattern by which the owner of the solar cell module can be distinguished.

16. A process for producing a solar cell module, said process including the steps of:

(i) sequentially stacking (a) at least one solar cell element, (b) a sealing resin, (c) a protective film, (d) a member capable of serving to form a desired display pattern in said sealing resin and/or said protective film, and (e) a covering member on a mounting table provided with an exhaust port to form a stacked body on said mounting table, and (ii) maintaining the stacked body while applying vacuum to said stacked body through said exhaust port of said mounting table.

17. The process according to claim 16, wherein a metal mesh member, a woven fiber member, or a nonwoven fiber member is interposed between the member (d) and the covering member (e).

18. The process according to claim 16, wherein the member (d) has an uneven surface.

19. The process according to claim 16, wherein the member (d) comprises a mesh.

20. The process according to claim 16, wherein the member (d) has an uneven surface provided with a plurality of minute irregularities which contacts the protective film (c).

21. The process according to claim 20, wherein the uneven surface pattern of the member (d) is designed depending on a desired display pattern to be formed on the light receiving face of the solar cell module.

22. The process according to claim 20, wherein the unevenness of the uneven surface of the member (d) is varied depending on a desired display pattern to be formed on the light receiving face of the solar cell module.

23. The process according to claim 16, wherein the step (ii) of applying vacuum to the stacked body is conducted while heating the stacked body.

24. The process according to claim 16, wherein the step (ii) includes a step of cooling the stacked body.

25. The process according to claim 16, wherein the step (ii) includes a step of heating the stacked body and a step of cooling the stacked body.

26. The process according to claim 16, wherein the sealing resin comprises a thermoplastic resin.

\* \* \* \* \*

UNITED STATES PATENT AND TRADEMARK OFFICE
CERTIFICATE OF CORRECTION

PATENT NO. : 5,782,994

DATED : JULY 21, 1998

INVENTOR(S) : MASAHIRO MORI, ET AL.

It is certified that error appears in the above-identified patent and that said Letters Patent is hereby corrected as shown below:

COLUMN 2

Line 48, "1is" should read --1 is--.

COLUMN 16

Line 27, "module" should read --modules--.

COLUMN 17

Line 20, "are" should read --is--; and
    Line 46, "are" should read --is--.

COLUMN 19

Line 40, close up right margin; and
    Line 41, close up left margin.

COLUMN 24

Line 53, "are" should read --is--.

UNITED STATES PATENT AND TRADEMARK OFFICE
CERTIFICATE OF CORRECTION

PATENT NO. : 5,782,994
DATED : JULY 21, 1998
INVENTOR(S) : MASAHIRO MORI, ET AL.

Page 2 of 2

It is certified that error appears in the above-identified patent and that said Letters Patent is hereby corrected as shown below:

COLUMN 26

Line 61, "claim 1," should read --claim 11,--.

Signed and Sealed this

Eighteenth Day of May, 1999

Attest:

Q. TODD DICKINSON

*Attesting Officer*     Acting Commissioner of Patents and Trademarks